(12) United States Patent
Scanlan et al.

(10) Patent No.: US 7,633,765 B1
(45) Date of Patent: *Dec. 15, 2009

(54) SEMICONDUCTOR PACKAGE INCLUDING A TOP-SURFACE METAL LAYER FOR IMPLEMENTING CIRCUIT FEATURES

(75) Inventors: Christopher Marc Scanlan, Chandler, AZ (US); Ronald Patrick Huemoeller, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 292 days.

This patent is subject to a terminal disclaimer.

(21) Appl. No.: 11/293,999

(22) Filed: Dec. 5, 2005

Related U.S. Application Data

(63) Continuation-in-part of application No. 10/806,640, filed on Mar. 23, 2004, now Pat. No. 7,185,426.

(51) Int. Cl.
*H05K 7/00* (2006.01)
(52) U.S. Cl. ........................ 361/760; 174/262
(58) Field of Classification Search .......... 361/760; 257/797; 438/401; 33/543, 613, 645; 174/262
See application file for complete search history.

(56) References Cited

U.S. PATENT DOCUMENTS

| | | | | |
|---|---|---|---|---|
| 3,868,724 | A | 2/1975 | Perrino | 357/65 |
| 3,916,434 | A | 10/1975 | Garboushian | 357/74 |
| 4,322,778 | A | 3/1982 | Barbour et al. | 361/414 |
| 4,532,419 | A | 7/1985 | Takeda | 235/492 |
| 4,642,160 | A | 2/1987 | Burgess | 156/630 |
| 4,645,552 | A | 2/1987 | Vitriol et al. | 156/89 |

(Continued)

FOREIGN PATENT DOCUMENTS

JP  05-109975  4/1993

(Continued)

OTHER PUBLICATIONS

IBM Technical Disclosure Bulletin, "Microstructure Solder Mask by Means of a Laser", vol. 36, Issue II, p. 589, Nov. 1, 1993. (NN9311589).

(Continued)

*Primary Examiner*—Dean A. Reichard
*Assistant Examiner*—Yuriy Semenenko
(74) *Attorney, Agent, or Firm*—Gunnison, McKay & Hodgson, L.L.P.; Serge J. Hodgson

(57) ABSTRACT

A semiconductor package including a top-surface metal layer for implementing circuit features provides improvements in top-surface interconnect density, more flexible routing and mounting of top surface semiconductor packages, dies and passive components or a conformal shield cap implementation. The metal layer interconnected with an internal substrate of the semiconductor package by blind vias laser-ablated through the encapsulation and filled with metal. The vias extend from the top surface to an internal package substrate or through the encapsulation to form bottom-side terminals. The metal layer may be formed by circuit patterns and/or terminals embedded within the encapsulation conformal to the top surface by laser-ablating channels in the top surface of the encapsulation and filling the channels with metal. A conformal coating may be applied to the top surface of the semiconductor package over the metal layer to prevent solder bridging to circuit patterns of the metal layer.

23 Claims, 4 Drawing Sheets

U.S. PATENT DOCUMENTS

| | | | | |
|---|---|---|---|---|
| 4,685,033 A | 8/1987 | Inoue | | 361/414 |
| 4,706,167 A | 11/1987 | Sullivan | | 361/406 |
| 4,716,049 A | 12/1987 | Patraw | | 427/96 |
| 4,786,952 A | 11/1988 | MacIver et al. | | 357/23.4 |
| 4,806,188 A | 2/1989 | Rellick | | 156/89 |
| 4,811,082 A | 3/1989 | Jacobs et al. | | 357/80 |
| 4,897,338 A | 1/1990 | Spicciati et al. | | 430/314 |
| 4,905,124 A | 2/1990 | Banjo et al. | | 361/395 |
| 4,964,212 A | 10/1990 | Deroux-Dauphin et al. | | 29/852 |
| 4,974,120 A | 11/1990 | Kodai et al. | | 361/392 |
| 4,996,391 A | 2/1991 | Schmidt | | 174/255 |
| 5,021,047 A | 6/1991 | Movern | | 604/110 |
| 5,072,075 A | 12/1991 | Lee et al. | | 174/264 |
| 5,072,520 A | 12/1991 | Nelson | | 29/852 |
| 5,081,520 A | 1/1992 | Yoshii et al. | | 357/80 |
| 5,091,769 A | 2/1992 | Eichelberger | | 357/72 |
| 5,108,553 A | 4/1992 | Foster et al. | | 205/125 |
| 5,110,664 A | 5/1992 | Nakanishi et al. | | 428/195 |
| 5,191,174 A | 3/1993 | Chang et al. | | 174/266 |
| 5,229,550 A | 7/1993 | Bindra et al. | | 174/262 |
| 5,239,448 A | 8/1993 | Perkins et al. | | 361/764 |
| 5,247,429 A | 9/1993 | Iwase et al. | | 362/29 |
| 5,250,843 A | 10/1993 | Eichelberger | | 257/692 |
| 5,278,726 A | 1/1994 | Bernardoni et al. | | 361/783 |
| 5,283,459 A | 2/1994 | Hirano et al. | | 257/419 |
| 5,353,498 A | 10/1994 | Fillion et al. | | 29/840 |
| 5,371,654 A | 12/1994 | Beaman et al. | | 361/744 |
| 5,379,191 A | 1/1995 | Carey et al. | | 361/777 |
| 5,404,044 A | 4/1995 | Booth et al. | | 257/698 |
| 5,463,253 A | 10/1995 | Waki et al. | | 257/724 |
| 5,474,957 A | 12/1995 | Urushima | | 437/209 |
| 5,474,958 A | 12/1995 | Djennas et al. | | 437/211 |
| 5,497,033 A | 3/1996 | Fillion et al. | | 257/723 |
| 5,508,938 A | 4/1996 | Wheeler | | 364/488 |
| 5,530,288 A | 6/1996 | Stone | | 257/700 |
| 5,531,020 A | 7/1996 | Durand et al. | | 29/840 |
| 5,546,654 A | 8/1996 | Wojnarowski et al. | | 29/841 |
| 5,574,309 A | 11/1996 | Papapietro et al. | | 257/679 |
| 5,581,498 A | 12/1996 | Ludwig et al. | | 365/63 |
| 5,582,858 A | 12/1996 | Adamopoulos et al. | | 427/96 |
| 5,616,422 A | 4/1997 | Ballard et al. | | 428/621 |
| 5,637,832 A | 6/1997 | Danner | | 174/260 |
| 5,674,785 A | 10/1997 | Akram et al. | | 437/217 |
| 5,719,749 A | 2/1998 | Stopperan | | 361/769 |
| 5,726,493 A | 3/1998 | Yamashita et al. | | |
| 5,739,581 A | 4/1998 | Chillara et al. | | 257/668 |
| 5,739,585 A | 4/1998 | Akram et al. | | 257/698 |
| 5,739,588 A | 4/1998 | Ishida et al. | | 257/782 |
| 5,742,479 A | 4/1998 | Asakura | | 361/737 |
| 5,774,340 A | 6/1998 | Chang et al. | | 361/771 |
| 5,784,259 A | 7/1998 | Asakura | | 361/752 |
| 5,798,014 A | 8/1998 | Weber | | 156/263 |
| 5,822,190 A | 10/1998 | Iwasaki | | 361/737 |
| 5,826,330 A | 10/1998 | Isoda et al. | | 29/852 |
| 5,835,355 A | 11/1998 | Dordi | | 361/760 |
| 5,847,453 A | 12/1998 | Uematsu et al. | | 257/728 |
| 5,883,425 A * | 3/1999 | Kobayashi | | 257/678 |
| 5,894,108 A | 4/1999 | Mostafazadeh et al. | | 174/52.4 |
| 5,903,052 A | 5/1999 | Chen et al. | | 257/706 |
| 5,907,477 A | 5/1999 | Tuttle et al. | | 361/760 |
| 5,936,843 A | 8/1999 | Ohshima et al. | | 361/760 |
| 5,952,611 A | 9/1999 | Eng et al. | | 174/52.4 |
| 6,004,619 A | 12/1999 | Dippon et al. | | 427/97 |
| 6,013,948 A | 1/2000 | Akram et al. | | 257/698 |
| 6,021,564 A | 2/2000 | Hanson | | 29/852 |
| 6,028,364 A | 2/2000 | Ogino et al. | | 257/778 |
| 6,034,427 A | 3/2000 | Lan et al. | | 257/698 |
| 6,040,622 A | 3/2000 | Wallace | | 257/679 |
| 6,060,778 A | 5/2000 | Jeong et al. | | 257/710 |
| 6,069,407 A | 5/2000 | Hamzehdoost | | 257/774 |
| 6,072,243 A | 6/2000 | Nakanishi | | 257/783 |
| 6,081,036 A | 6/2000 | Hirano et al. | | 257/773 |
| 6,119,338 A | 9/2000 | Wang et al. | | 29/852 |
| 6,122,171 A | 9/2000 | Akram et al. | | 361/704 |
| 6,127,833 A | 10/2000 | Wu et al. | | 324/755 |
| 6,160,705 A | 12/2000 | Stearns et al. | | 361/704 |
| 6,172,419 B1 | 1/2001 | Kinsman | | 257/737 |
| 6,175,087 B1 | 1/2001 | Keesler et al. | | 174/261 |
| 6,184,463 B1 | 2/2001 | Panchou et al. | | 174/52.4 |
| 6,194,250 B1 | 2/2001 | Melton et al. | | |
| 6,204,453 B1 | 3/2001 | Fallon et al. | | 174/255 |
| 6,214,641 B1 | 4/2001 | Akram | | 438/107 |
| 6,235,554 B1 | 5/2001 | Akram et al. | | 438/109 |
| 6,239,485 B1 | 5/2001 | Peters et al. | | 257/700 |
| D445,096 S | 7/2001 | Wallace | | D14/117 |
| D446,525 S | 8/2001 | Okamoto et al. | | D14/436 |
| 6,274,821 B1 | 8/2001 | Echigo et al. | | 174/255 |
| 6,280,641 B1 | 8/2001 | Gaku et al. | | 216/17 |
| 6,316,285 B1 | 11/2001 | Jiang et al. | | 438/106 |
| 6,351,031 B1 | 2/2002 | Iijima et al. | | 257/698 |
| 6,353,999 B1 | 3/2002 | Cheng | | 29/852 |
| 6,365,975 B1 | 4/2002 | DiStefano et al. | | 257/777 |
| 6,376,906 B1 | 4/2002 | Asai et al. | | 257/698 |
| 6,392,160 B1 | 5/2002 | Andry et al. | | 174/261 |
| 6,395,578 B1 | 5/2002 | Shin et al. | | 438/106 |
| 6,405,431 B1 | 6/2002 | Shin et al. | | 29/852 |
| 6,406,942 B2 | 6/2002 | Honda | | 438/119 |
| 6,407,341 B1 | 6/2002 | Anstrom et al. | | 174/255 |
| 6,407,930 B1 | 6/2002 | Hsu | | 361/784 |
| 6,448,510 B1 | 9/2002 | Neftin et al. | | |
| 6,451,509 B2 | 9/2002 | Keesler et al. | | 430/311 |
| 6,479,762 B2 | 11/2002 | Kusaka | | 174/261 |
| 6,497,943 B1 | 12/2002 | Jimarez et al. | | 428/209 |
| 6,517,995 B1 | 2/2003 | Jacobson et al. | | 430/320 |
| 6,534,391 B1 | 3/2003 | Huemoeller et al. | | 438/612 |
| 6,544,638 B2 | 4/2003 | Fischer et al. | | 428/322.7 |
| 6,586,682 B2 | 7/2003 | Strandberg | | 174/255 |
| 6,608,757 B1 | 8/2003 | Bhatt et al. | | 361/748 |
| 6,660,559 B1 | 12/2003 | Huemoeller et al. | | 438/106 |
| 6,715,204 B1 | 4/2004 | Tsukada et al. | | 29/847 |
| 6,727,645 B2 | 4/2004 | Tsujimura et al. | | 313/504 |
| 6,730,857 B2 | 5/2004 | Konrad et al. | | 174/257 |
| 6,734,542 B2 | 5/2004 | Nakatani et al. | | 257/687 |
| 6,740,964 B2 | 5/2004 | Sasaki | | |
| 6,753,612 B2 | 6/2004 | Adae-Amoakoh et al. | | 257/774 |
| 6,774,748 B1 * | 8/2004 | Ito et al. | | 333/247 |
| 6,787,443 B1 | 9/2004 | Boggs et al. | | 438/612 |
| 6,803,528 B1 | 10/2004 | Koyanagi | | 174/262 |
| 6,815,709 B2 | 11/2004 | Clothier et al. | | 257/40 |
| 6,815,739 B2 | 11/2004 | Huff et al. | | 257/275 |
| 6,838,776 B2 | 1/2005 | Leal et al. | | |
| 6,888,240 B2 | 5/2005 | Towle et al. | | |
| 6,919,514 B2 | 7/2005 | Konrad et al. | | |
| 6,921,968 B2 | 7/2005 | Chung | | |
| 6,921,975 B2 | 7/2005 | Leal et al. | | |
| 6,953,995 B2 * | 10/2005 | Farnworth et al. | | 257/735 |
| 7,015,075 B2 | 3/2006 | Fay et al. | | |
| 7,030,469 B2 | 4/2006 | Mahadevan et al. | | 257/659 |
| 7,081,661 B2 | 7/2006 | Takehara et al. | | 257/433 |
| 7,125,744 B2 | 10/2006 | Takehara et al. | | 438/106 |
| 7,198,980 B2 * | 4/2007 | Jiang et al. | | 438/107 |
| 7,242,081 B1 | 7/2007 | Lee | | |
| 7,282,394 B2 * | 10/2007 | Cho et al. | | 438/118 |
| 7,285,855 B2 * | 10/2007 | Foong | | 257/738 |
| 7,345,361 B2 | 3/2008 | Mallik et al. | | |
| 7,372,151 B1 | 5/2008 | Fan et al. | | |
| 7,429,786 B2 | 9/2008 | Karnezos et al. | | |
| 2002/0017712 A1 | 2/2002 | Bessho et al. | | 257/700 |
| 2002/0061642 A1 * | 5/2002 | Haji et al. | | 438/613 |
| 2002/0066952 A1 | 6/2002 | Taniguchi et al. | | |
| 2002/0195697 A1 | 12/2002 | Mess et al. | | |
| 2003/0025199 A1 | 2/2003 | Wu et al. | | |
| 2003/0128096 A1 | 7/2003 | Mazzochette | | 338/22 |
| 2003/0141582 A1 | 7/2003 | Yang et al. | | |

| | | | |
|---|---|---|---|
| 2003/0197284 A1 | 10/2003 | Khiang et al. | |
| 2004/0063246 A1* | 4/2004 | Karnezos | 438/108 |
| 2004/0145044 A1 | 7/2004 | Sugaya et al. | |
| 2004/0159462 A1 | 8/2004 | Chung | 174/259 |
| 2005/0139985 A1 | 6/2005 | Takahashi | |
| 2005/0242425 A1 | 11/2005 | Leal et al. | |
| 2007/0273049 A1 | 11/2007 | Khan et al. | |
| 2007/0290376 A1 | 12/2007 | Zhao et al. | |
| 2008/0230887 A1 | 9/2008 | Sun et al. | |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Hiner et al., U.S. Appl. No. 10/806,640, filed Mar. 23, 2004, entitled "Method of Manufacturing a Semiconductor Package".

Hiner et al., U.S. Appl. No. 10/992,371, filed Nov. 18, 2004, entitled "Printed Wiring Motherboard Having Bonded Interconnect Redistribution Mesa".

Huemoeller et al., U.S. Appl. No. 11/497,617, filed Aug. 1, 2006, entitled "Buildup Dielectric and Metallization Process and Semiconductor Package".

Hiner et al., U.S. Appl. No. 11/595,411, filed Nov. 9, 2006, entitled "Semiconductor Package Including Top-Surface Terminals for Mounting Another Semiconductor Package".

Huemoeller et al., U.S. Appl. No. 11/824,395, filed Jun. 29, 2007, entitled "Build Up Motherboard Fabrication Method and Structure".

Longo et al., "Stacked Redistribution Layer (RDL) Die Assembly Package", U.S. Appl. No. 11/560,496, filed Nov. 16, 2006.

Berry et al., "Thin Stacked Interposer Package", U.S. Appl. No. 11/865,617, filed Oct. 1, 2007.

Scanlan, "Package-on package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

\* cited by examiner

SEMICONDUCTOR PACKAGE INCLUDING A TOP-SURFACE METAL LAYER FOR IMPLEMENTING CIRCUIT FEATURES

CROSS-REFERENCE TO RELATED APPLICATIONS

The present application is a continuation-in-part of U.S. Patent Application "SEMICONDUCTOR PACKAGE INCLUDING TOP-SURFACE TERMINALS FOR MOUNTING ANOTHER SEMICONDUCTOR PACKAGE", Ser. No. 10/806,640 filed on Mar. 23, 2004 now U.S. Pat. No. 7,185,426. The above-referenced application has at least one common inventor and assigned to the same assignee. The specification of the above-referenced U.S. Patent Application is incorporated herein by reference.

FIELD OF THE INVENTION

The present invention relates generally to semiconductor packaging, and more specifically, to a semiconductor package having blind vias for interconnecting a metal layer atop the semiconductor package to internal circuits of the semiconductor package.

BACKGROUND OF THE INVENTION

Semiconductor packages that provide mechanical mounting and electrical interconnection of a semiconductor die are commonly provided in ball grid array and land grid array configurations. A semiconductor die is electrically connected to a substrate with grid array terminals disposed on the "bottom" side of the semiconductor package and solder balls are attached for connection to a system substrate, typically a printed circuit board (PCB) having lands located to attach the solder balls of the semiconductor package (referred to as ball grid array or BGA attach). Alternatively, conductive paste, a socket or "interposer" may be used to provide contacts between lands of the semiconductor package and lands on the system substrate (referred to as land grid array or LGA connection).

The above-incorporated Parent U.S. Patent Application discloses a top-surface mounting terminal structure for attaching a second semiconductor package or die to the top of a first semiconductor package. While the packaging density of the combined devices is increased, the location of the terminals is dictated by the design of the die or semiconductor package mounted on the first semiconductor package, which typically increases the interconnect density of the substrate in the first semiconductor package.

Also, it is often desirable to provide a metal shield cap atop a semiconductor package. Such shields are usually connected to a ground terminal or other reference voltage level by a through via extending through the semiconductor package to one or more terminals.

Therefore, it would be desirable improve upon the techniques of the above-incorporated parent U.S. Patent Application to provide a semiconductor package and a method of manufacturing such a semiconductor package that facilitates stacking of grid arrays and other components while reducing interconnect densities in the semiconductor package and increases flexibility of design. It would further be desirable to improve the techniques of the above-incorporated parent U.S. Patent Application to provide a semiconductor package and method of manufacture that provides a metal shield cap without requiring additional through vias.

SUMMARY OF THE INVENTION

The above objectives are accomplished in a semiconductor package having one or more metal patterns conformal to the top surface of an encapsulation of the semiconductor package. The one or more metal patterns are electrically connected to an interconnect substrate within the semiconductor package or terminals on the bottom of the semiconductor package by blind vias laser-ablated through the to the substrate or through the circuit package and subsequently filled with metal.

The top-surface metal circuit patterns may include via capture lands, interconnect patterns, terminals for connection of semiconductor package or dies and/or passive components or may implement a single contiguous shield cap. The blind vias may be filled with conductive paste or a low melting-temperature alloy or plated. The vias may have a conical profile to improved plating uniformity. The vias may terminate on the internal substrate circuit pattern, or may pass through the encapsulation and the substrate to provide lands for bottom-side terminals. A conformal coating (solder mask) may be applied to the top surface of the semiconductor package exclusive of terminal areas of the one or more metal patterns to prevent solder flow to circuit patterns implemented by the one or more metal patterns.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The present invention concerns a semiconductor package and a method for manufacturing a semiconductor package that include a metal layer formed atop a semiconductor package encapsulation and connected to an internal substrate of the semiconductor package by blind vias and/or terminals on the bottom side of the encapsulation by through vias.

While the exemplary embodiments depict ball grid array packages, it will be understood by those skilled in the art, that the techniques of the present invention can be extended to other types of semiconductor packages. The exemplary embodiments also show wirebond die connections within the semiconductor package, but it will be understood that any type of internal die and die mounting can be used within the semiconductor package embodiments of the present invention.

Figure 1A:
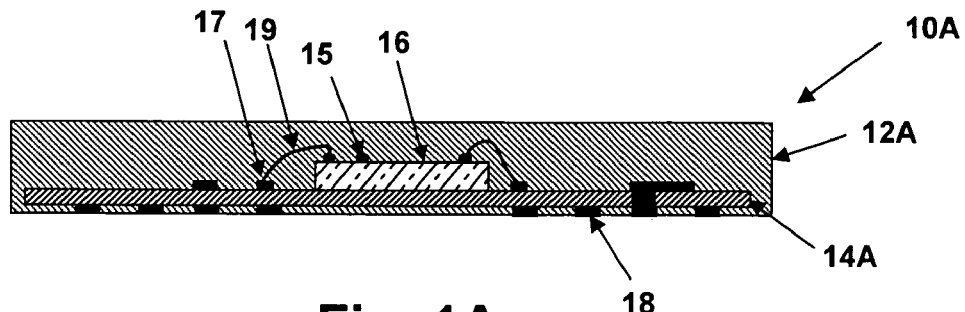
FIGS. 1A-1H are pictorial diagrams depicting stages in preparation of a semiconductor package in accordance with an embodiment of the present invention.

Referring now to FIG. 1A, a semiconductor package 10A for forming a semiconductor package in accordance with an embodiment of the invention and corresponding to a first illustrated step of manufacture is depicted. Semiconductor package 10A is in the form of a ball grid array (BGA) or land grid array (LGA) package as is commonly known in the art, except that particular circuit features are positioned for providing vias to the top side of semiconductor package 10A in subsequent manufacturing steps, so that connections may be made to features to be formed in subsequent steps.

Semiconductor package 10A includes a die 16 mounted to a substrate 14A that includes lands 18 to which solder ball terminals may be attached or that may be connected with a conductive paste to form a LGA mounted semiconductor package. Encapsulation 12A surrounds die 16 and substrate 14A, although substrate 14A may alternatively be exposed on a bottom side of semiconductor package 10A. Electrical connections 15 of die 16 are connected to circuit patterns 17 on substrate 14A via wires 19, but the type of die mounting is not limiting, but exemplary and other die mounting types may be used such as flip-chip die mounting. Additionally, while substrate 14A is depicted as a film or laminate-type mounting structure, lead frame and other substrate technologies may be used within the structures of the present invention.

Figure 1B:
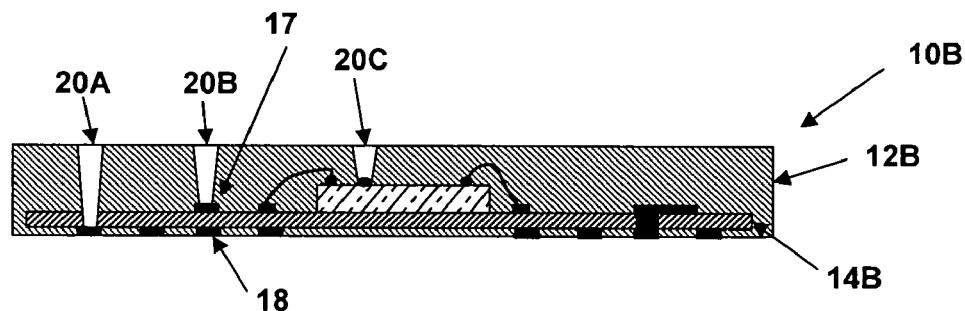

Referring now to FIG. 1B, a first modification to semiconductor package 10A that illustrates a second step in the manufacturing process to form semiconductor package 10B is shown. Semiconductor package 10B includes a plurality of via holes 20A, 20B and 20C laser-ablated through encapsulation 12A of FIG. 1A to form encapsulation 12B. While only three via holes are shown, many via holes may be provided. The three via holes shown and as disclosed in the above-incorporated parent U.S. Patent Application illustrate the three different types of via holes that may be provided through control of laser energy and exposure time. The first via hole type, illustrated as via 20A, is fabricated by laser-ablating either completely through semiconductor package 10B or by laser-ablating through encapsulation 12A to the top side of lands 18, so that a connection is provided through from the top side of semiconductor package 10B to the bottom side of semiconductor package 10B when the via is filled. If via 20A is ablated completely through, then the corresponding land 18 is provided by the bottom surface of a via formed in hole 20A.

The next type of via hole is provided by laser-ablating through encapsulation 12A to reach circuit pattern 17 so that connection may be made through substrate 14A circuit patterns to die 16 electrical terminals, to lands 18 or both. The last type of via is provided by laser-ablating through encapsulation 12A to reach electrical connections 15 of die 16 so that direct connection to the circuits of die 16 can be made from a piggybacked semiconductor package. Each of via holes 20A, 20B and 20C is depicted as a via hole having a conical cross-section, which is desirable for providing uniform plating current density during a plating process. However, via holes 20A, 20B and 20C may alternatively be made cylindrical in shape if the advantage of conical cross-section is not needed, for example if a conductive paste is used to fill the via holes.

Figure 1C:
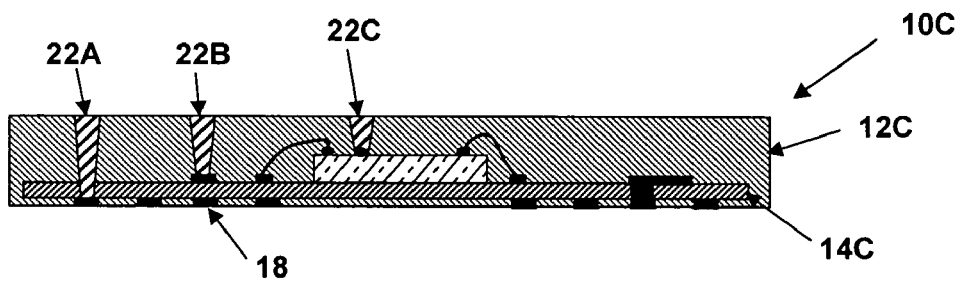

Referring now to FIG. 1C, a semiconductor package step 10C is illustrated. Conductive material applied within via holes 20A, 20B and 20C to form conductive vias 22A, 22B and 22C through encapsulation 12C and optionally substrate 14C for vias that are formed completely through substrate 14C. The conductive material used form vias 22A, 22B and 22C may be electroplated or electro-less plated metal, conductive paste such as copper or silver epoxy compounds, or a low melting temperature high-wicking solder alloy such as SUPER SOLDER.

Figure 1D:
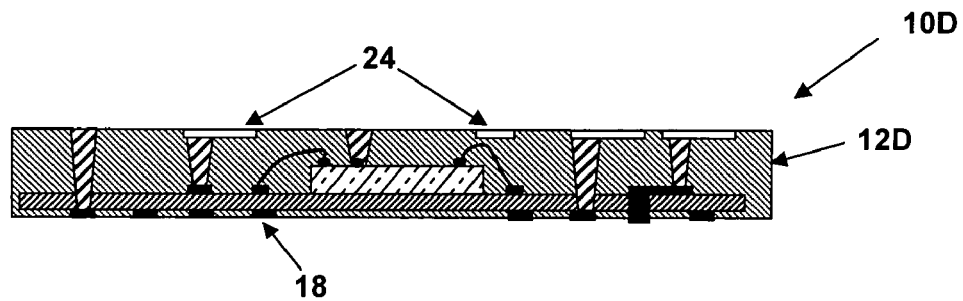

Referring now to FIG. 1D, a next step of preparation of a semiconductor package 10D is illustrated. Channels 24 are laser-ablated in the top surface of encapsulation 12C to form encapsulation 12D. Channels 24 may define circuit traces, terminals and other features that either provide complete interconnection at the top surface of encapsulation 12D or connect top-side features such as circuit traces and terminals to one or more of vias 22A, 22B and 22C.

Figure 1E:
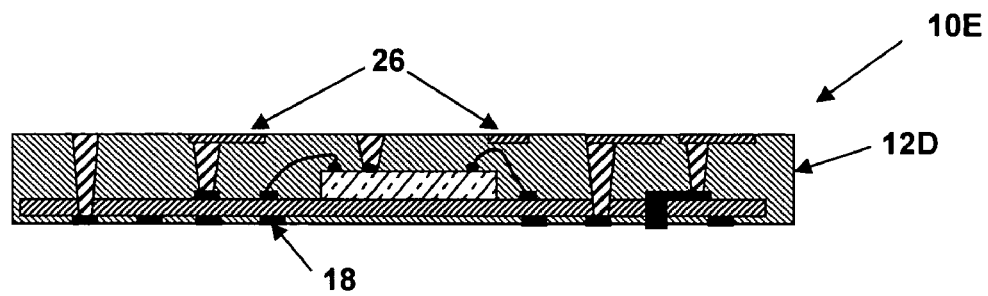

Next, as shown in FIG. 1E, channels 24 are filled to provide a metal layer 26 in a semiconductor package step 10E. Channels 24 may be filled by electroplating, filling with conductive paste with planarization if required, or electro-less plating after treating channels 24 with an activating compound. Further, the top surface of encapsulation 12D may be overplated or over-pasted and then etched to isolate the circuit features of metal layer 26.

Figure 1F:
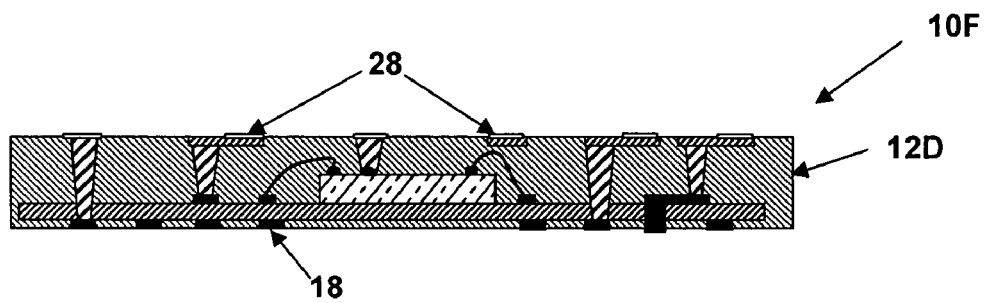

After formation of metal layer 26, plating 28 may be applied as shown in FIG. 1F, yielding semiconductor package step 10F to protect the surface of metal layer and/or to prepare terminal areas defined by the top surface of metal layer 26 for further processing such as wire bond attach or soldering.

Figure 1G:
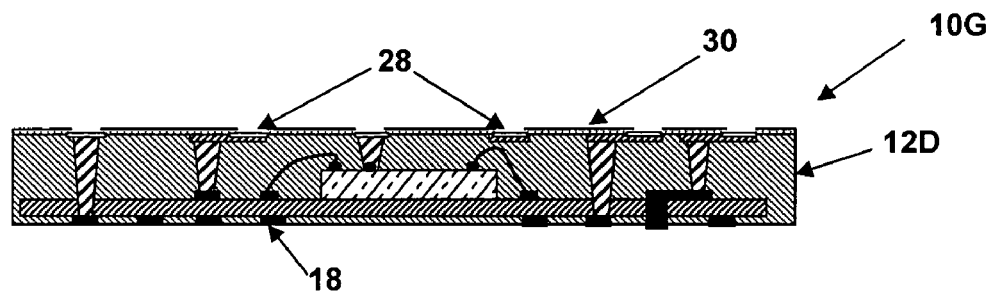

Then, as shown in FIG. 1G, a solder mask 30 may be applied over the top of encapsulation 12D and portions of the metal layer 26, yielding semiconductor package step 10G. Solder mask 30 is useful in operations where reflow solder operations will be used to attach components to metal layer 26.

Figure 1H:
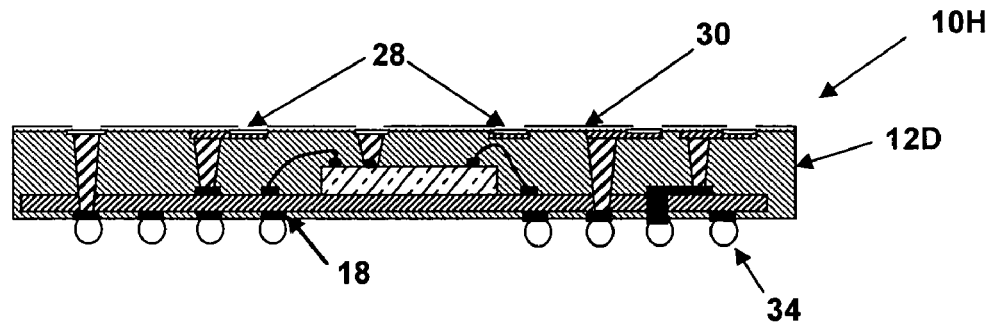

Solder balls 34 may be attached to bottom-side terminals 18 of semiconductor package step 10G to yield a completed ball-grid-array (BGA) package 10H that is ready for mounting on a circuit board or other mounting location. Alternatively, as with all depicted final semiconductor packages described herein below, the step illustrated in FIG. 1H may be omitted and bottom side terminals 18 plated, yielding a land-grid-array (LGA) package.

Figure 2A:
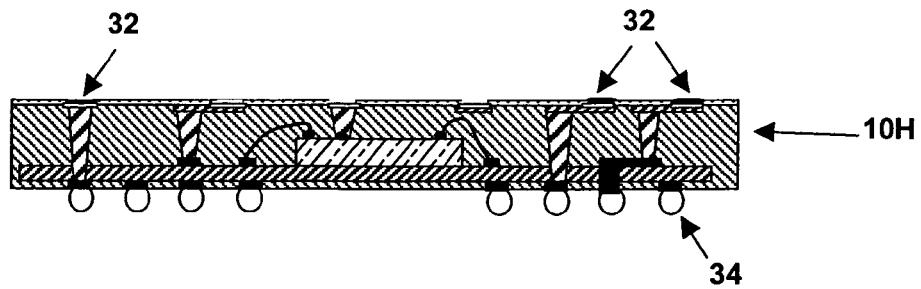
FIGS. 2A-2D are pictorial diagrams depicting further stages in assembly of a semiconductor package in accordance with another embodiment of the present invention.

A "tinning" coat of solder 32 may be applied to the top side of semiconductor package 10H as illustrated by FIG. 2A to prepare for mounting of top side components. The solder may be selectively applied to only solder mounting terminal areas via a mask.

Figure 2B:
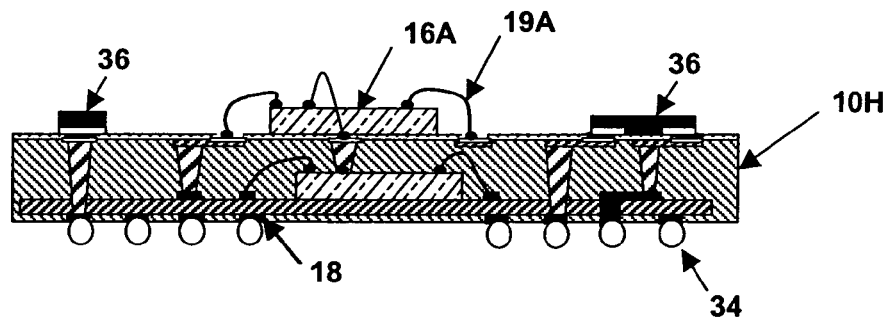
Figure 2C:
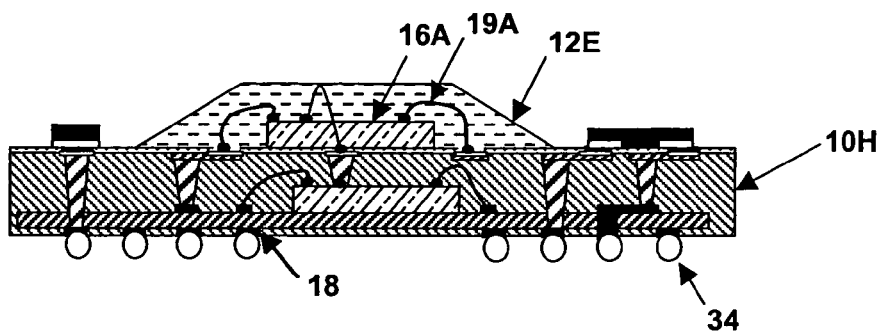

Next, components are mounted on the top side of semiconductor package 10H and attached to metal layer 26 as illustrated in FIG. 2B. It will be apparent that the steps of attaching solder balls depicted in FIG. 1H can be performed after this step and that in general, various steps in formation of structures above encapsulation 12D may be performed at different times. FIG. 2B illustrates mounting of another semiconductor die 16A that is wire-bonded via wires 19A to plated terminals of metal layer 26 and also mounting of discrete surface-mount components 36 via reflow soldering.

After attachment and interconnection of die 16A, a second encapsulation 12E may be applied over die 16A, wires 19A and part of the top surface of encapsulation 12D to form a completed assembly.

Figure 2D:
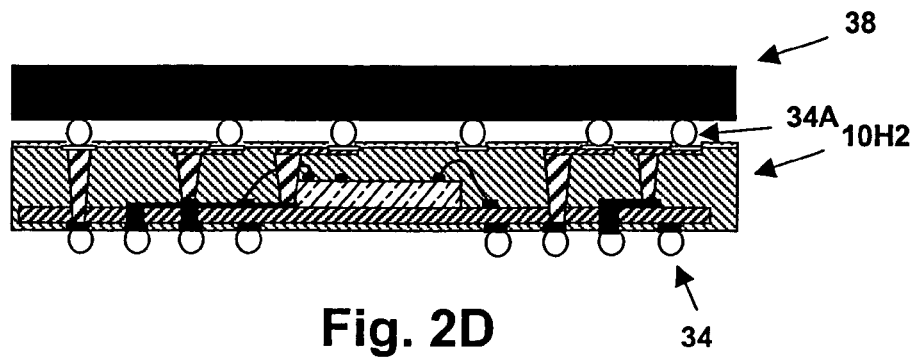

Another alternative embodiment of the present invention is shown in FIG. 2D. In FIG. 2D, another semiconductor package 38 may be ball-mounted to terminals formed on metal layer 26. The depicted embodiment provides for redistribution of terminals at virtually any position atop semiconductor package 10H2, since metal layer 26 can provide routing of circuits from vias such as 22A-C to solder balls 34A at virtually any position atop semiconductor package 10H2.

Figure 3A:
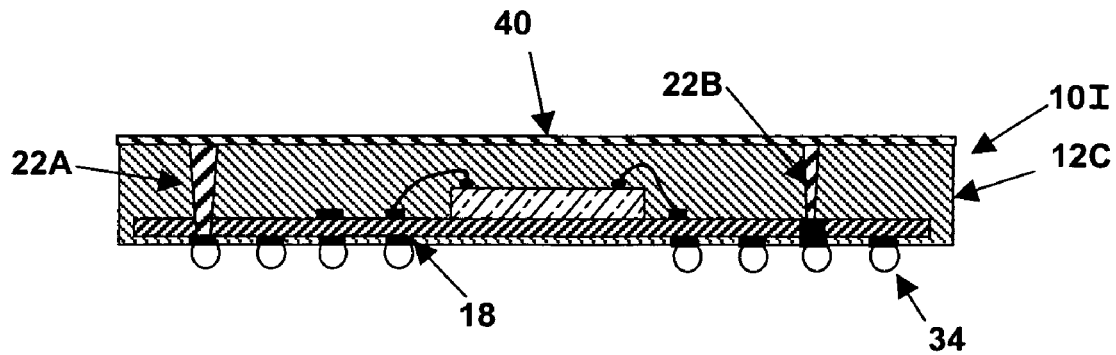
FIG. 3A is a pictorial diagram depicting a semiconductor package in accordance with another embodiment of the present invention.

FIG. 3A illustrates another embodiment of the present invention that includes a metal layer 40 that provides a shield cap for semiconductor package 10I. Metal layer 40 may be electro-less plated atop encapsulation 12C (See FIGS. 1A-1C for formation steps prior to FIG. 3A) by applying a seed layer or may be paste screened to form metal layer 40. Metal layer may be solid layer, or a continuous pattern such as a mesh screen to reduce separation and required metal to improve the plating process. Metal layer 40 is electrically connected to vias 22A and/or 22B to provide a return path for the shield.

Figure 3B:
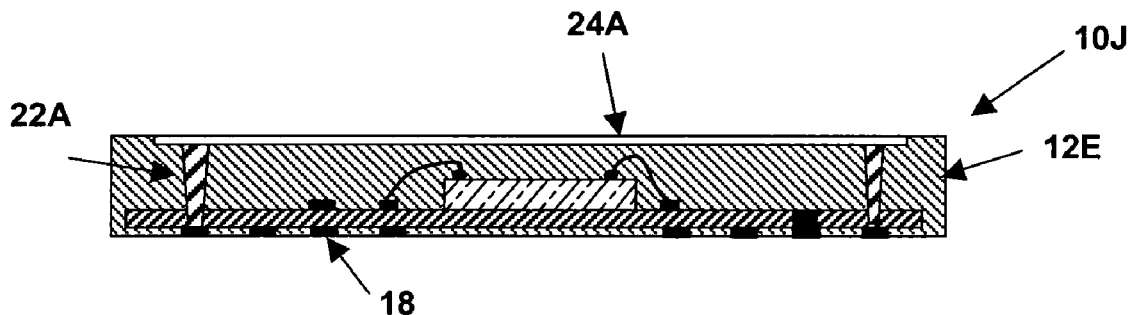
FIGS. 3B-3C are pictorial diagrams depicting stages in fabrication of a semiconductor package in accordance with yet another embodiment of the present invention.
Figure 3C:
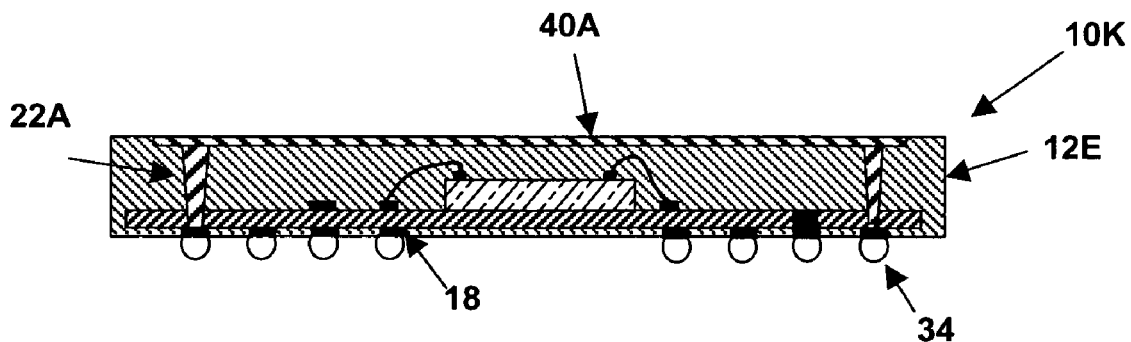

FIG. 3B illustrates another shield embodiment of the present invention. A shield cavity is laser-ablated in the top surface of encapsulation 12E to form a semiconductor package step 10J having a cavity 24A. Cavity 24A is then filled to form a metal shield layer 40A as shown in FIG. 3C. Metal layer 40A may be applied by paste screening or plating (and possible subsequent etching process) to yield a shield that is contained within the sides of semiconductor package 10K.

The above description of embodiments of the invention is intended to be illustrative and not limiting. Other embodiments of this invention will be obvious to those skilled in the art in view of the above disclosure and fall within the scope of the present invention.

What is claimed is:

1. A semiconductor package, comprising:
    a semiconductor die;
    a substrate including a conductive circuit pattern connecting electrical connections of the semiconductor die to a plurality of bottom-side terminals accessible from a bottom side of the substrate, wherein the semiconductor die is mounted on a top surface of the substrate;
    an encapsulation covering the semiconductor die and at least the top surface of the substrate;
    a plurality of blind vias formed in the encapsulation; and
    a metal layer in direct contact with the encapsulation and disposed at a top surface of the encapsulation for providing one or more electrical features of the semiconductor package, and wherein at least one of the electrical features provided by the metal layer is connected to at least one of the conductive circuit pattern of the substrate, the electrical connections of the semiconductor die and the bottom-side terminals by the blind vias.

2. The semiconductor package of claim 1, wherein the metal layer implements a shield cap extending over a substantial portion of the top surface of the encapsulation, and wherein the blind vias provide an electrical return path for the shield cap.

3. The semiconductor package of claim 1, wherein the metal layer implements a circuit pattern and terminals for connecting at least one external component to the substrate.

4. The semiconductor package of claim 3, wherein the metal layer implements terminals for mounting another semiconductor die.

5. The semiconductor package of claim 3, wherein the metal layer implements terminals for mounting at least one passive component.

6. The semiconductor package of claim 3, wherein the metal layer implements terminals for mounting another semiconductor package.

7. The semiconductor package of claim 3, further comprising a solder mask layer applied over the top surface of the encapsulation and the metal layer.

8. The semiconductor package of claim 1, wherein the metal layer is embedded within the encapsulation by forming the metal layer within laser-ablated channels having sides perpendicular to and extending beneath the top surface of the encapsulation and having bottoms disposed beneath the top surface of the encapsulation, and wherein the channels are substantially filled by the metal layer to provide the electrical feature as an embedded circuit pattern.

9. The semiconductor package of claim 1, wherein at least one of the electrical features provided by the metal layer is connected to the conductive circuit pattern of the substrate by at least one of the blind vias.

10. The semiconductor package of claim 1, wherein at least one of the electrical features provided by the metal layer is connected by at least one of the blind vias to at least one terminal disposed on the bottom side of the substrate and exposed on a bottom side of the encapsulation.

11. The semiconductor package of claim 1, wherein at least one of the electrical features provided by the metal layer is connected to at least one of the electrical connections of the semiconductor die by at least one of the blind vias.

12. The semiconductor package of claim 1, wherein the metal layer is a plated layer.

13. The semiconductor package of claim 1, wherein the metal layer is a paste-applied layer.

14. A semiconductor package, comprising:
    a substrate;
    a semiconductor die mounted to the substrate, wherein the semiconductor die is electrically connected to a circuit pattern of the substrate, the substrate having a plurality of bottom side electrical terminals on a bottom side for providing electrical connection to the semiconductor die;
    an encapsulation encapsulating the semiconductor die and at least a top surface of the substrate;
    via holes laser-ablating through the encapsulation;
    electrically conductive vias formed by depositing conductive material within the via holes;
    channels laser-ablated in a top surface of the encapsulation; and
    at least one electrical feature within the channels and in direct contact with the encapsulation, wherein the at least one electrical feature is electrically connected to the circuit pattern of the substrate by at least one of the vias.

15. The semiconductor package of claim 14 wherein the vias are vertical channels extending through the encapsulation.

16. The semiconductor package of claim 14 wherein a first via hole type of the via holes is formed by laser-ablating though the encapsulation and substrate to the bottom side electrical terminals.

17. The semiconductor package of claim 16 wherein a second via hole type of the via holes is formed by laser-ablating though the encapsulation to the circuit pattern of the substrate.

18. The semiconductor package of claim 17 wherein a third via hole type of the via holes is formed by laser-ablating though the encapsulation to electrical connections of the semiconductor die.

19. A method of manufacturing a semiconductor package, comprising:
    mounting a semiconductor die to a substrate;
    electrically connecting the semiconductor die to a circuit pattern of the substrate, wherein the substrate has a plurality of bottom side electrical terminals on a bottom side for providing electrical connection to the semiconductor die;
    encapsulating the semiconductor die and at least the top surface of the substrate to form an encapsulation;
    laser-ablating via holes through the encapsulation;
    depositing conductive material within the via holes to form vias; and
    forming a metal layer in direct contact with the encapsulation and disposed at a top surface of the encapsulation that implements at least one electrical feature of the semiconductor package on the top surface of the encapsulation, wherein the at least one electrical feature is electrically connected to the circuit pattern of the substrate by at least one of the vias.

20. The method of claim 19, wherein the forming comprises plating the metal layer.

21. The method of claim 19, wherein the forming comprises paste-forming the metal layer.

22. The method of claim 19, wherein the forming comprises:

laser-ablating channels in the top surface of the encapsulation, the channels having sides perpendicular to and extending beneath the top surface of the encapsulation and having bottoms disposed beneath the top surface of the encapsulation; and filling the channels with metal to provide the at least one electrical feature.

23. The method of claim 19, further comprising applying a solder mask to the top surface of the encapsulation exclusive of terminal areas of the metal layer.

* * * * *

UNITED STATES PATENT AND TRADEMARK OFFICE
CERTIFICATE OF CORRECTION

PATENT NO.        : 7,633,765 B1                                    Page 1 of 1
APPLICATION NO.   : 11/293999
DATED             : December 15, 2009
INVENTOR(S)       : Christopher Marc Scanlan and Ronald Patrick Huemoeller It is certified that error appears in the above-identified patent and that said Letters Patent is hereby corrected as shown below:

In Column 6, Claim 16, Line 43, replace "though" with --through--;
    In Column 6, Claim 17, Line 47, replace "though" with --through--; and
    In Column 6, Claim 18, Line 51, replace "though" with --through--.

Signed and Sealed this

Sixteenth Day of March, 2010

David J. Kappos
*Director of the United States Patent and Trademark Office*